US012394695B2

(12) United States Patent
Lu

(10) Patent No.: US 12,394,695 B2
(45) Date of Patent: *Aug. 19, 2025

(54) SEMICONDUCTOR DEVICE PACKAGE

(71) Applicant: Advanced Semiconductor Engineering, Inc., Kaohsiung (TW)

(72) Inventor: Shih-Wen Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/440,915

(22) Filed: Feb. 13, 2024

(65) Prior Publication Data

US 2024/0186223 A1      Jun. 6, 2024

Related U.S. Application Data

(63) Continuation of application No. 17/010,714, filed on Sep. 2, 2020, now Pat. No. 11,901,270.

(51) Int. Cl.
*H01L 23/495* (2006.01)
*H01L 23/06* (2006.01)
*H01L 23/538* (2006.01)
*H01P 3/00* (2006.01)

(52) U.S. Cl.
CPC ........ *H01L 23/49575* (2013.01); *H01L 23/06* (2013.01); *H01L 23/5384* (2013.01); *H01P 3/00* (2013.01)

(58) Field of Classification Search
CPC ............... H01L 23/49575; H01L 23/06; H01L 23/5384; H01P 3/00
See application file for complete search history.

(56) References Cited

U.S. PATENT DOCUMENTS

| | | | |
|---|---|---|---|
| 5,528,074 A | 6/1996 | Goto et al. | |
| 6,917,526 B2 | 7/2005 | Ajioka et al. | |
| 7,236,070 B2 | 6/2007 | Ajioka et al. | |
| 9,887,449 B2 * | 2/2018 | Qiang | G01S 7/03 |
| 9,978,688 B2 | 5/2018 | Yen et al. | |
| 10,056,922 B1 * | 8/2018 | Tsvelykh | H01P 1/20 |
| 10,416,381 B1 | 9/2019 | Chen et al. | |
| 10,700,440 B1 * | 6/2020 | Taveniku | H01Q 9/0414 |
| 11,901,270 B2 * | 2/2024 | Lu | H01L 25/0655 |
| 2002/0167060 A1 | 11/2002 | Buijsman et al. | |
| 2004/0233644 A1 | 11/2004 | Ajioka et al. | |

(Continued)

FOREIGN PATENT DOCUMENTS

CN      104022106 B      10/2017

OTHER PUBLICATIONS

Final Office Action U.S. Appl. No. 17/010,714, issued Jul. 1, 2022, 12 pages.

(Continued)

*Primary Examiner* — Eugene Lee
(74) *Attorney, Agent, or Firm* — FOLEY & LARDNER LLP

(57) ABSTRACT

A semiconductor device package includes a substrate and a conductive lid. The conductive lid is disposed within the substrate. The conductive lid defines a waveguide having a cavity. The waveguide is configured to transmit a signal from a first electronic component to a second electronic component through the cavity.

20 Claims, 10 Drawing Sheets

(56) References Cited

U.S. PATENT DOCUMENTS

| | | |
|---|---|---|
| 2005/0122698 A1 | 6/2005 | Ho et al. |
| 2011/0095385 A1 | 4/2011 | Kawamura |
| 2012/0182066 A1 | 7/2012 | Merkle et al. |
| 2013/0265733 A1 | 10/2013 | Herbsommer et al. |
| 2014/0320231 A1 | 10/2014 | Seler et al. |
| 2016/0247780 A1 | 8/2016 | Seler et al. |
| 2016/0336638 A1 | 11/2016 | Dang et al. |
| 2018/0310399 A1 | 10/2018 | Nair et al. |
| 2019/0280368 A1 | 9/2019 | Khan et al. |
| 2019/0287908 A1 | 9/2019 | Dogiamis et al. |
| 2020/0021007 A1 | 1/2020 | Nair et al. |
| 2020/0066661 A1* | 2/2020 | Tschumakow ......... H01P 7/065 |
| 2020/0106152 A1 | 4/2020 | Fruehling et al. |
| 2022/0173489 A1 | 6/2022 | Dogiamis et al. |

OTHER PUBLICATIONS

Non-Final Office Action U.S. Appl. No. 17/010,714, issued Mar. 20, 2023, 10 pages.

Notice of Allowance U.S. Appl. No. 17/010,714, issued Oct. 2, 2023, 5 pages.

US Office Action for U.S. Appl. No. 17/010,714, issued Feb. 2, 2022, 12 pages.

* cited by examiner

SEMICONDUCTOR DEVICE PACKAGE

CROSS REFERENCE TO RELATED APPLICATION

This is a continuation of U.S. patent application Ser. No. 17/010,714, filed Sep. 2, 2020, now U.S. Pat. No. 11,901,270, the content of which is incorporated herein by reference in its entirety.

BACKGROUND

1. Technical Field

The present disclosure relates to a semiconductor device package and a method of manufacturing the same, and more particularly to a semiconductor device package including a waveguide and a method of manufacturing the same.

2. Description of the Related Art

Wireless communication devices, such as cell phones, typically include antennas for transmitting and receiving radio frequency (RF) signals. To reduce signal loss during the transmission, a waveguide may be used. A waveguide is a structure that guides waves, such as electromagnetic waves, with minimal loss of energy by restricting the transmission of energy to one direction.

SUMMARY

In accordance with some embodiments of the present disclosure, a semiconductor device package includes a substrate and a conductive lid. The conductive lid is disposed within the substrate. The conductive lid defines a waveguide having a cavity. The waveguide is configured to transmit a signal from a first electronic component to a second electronic component through the cavity.

Figure 1A:
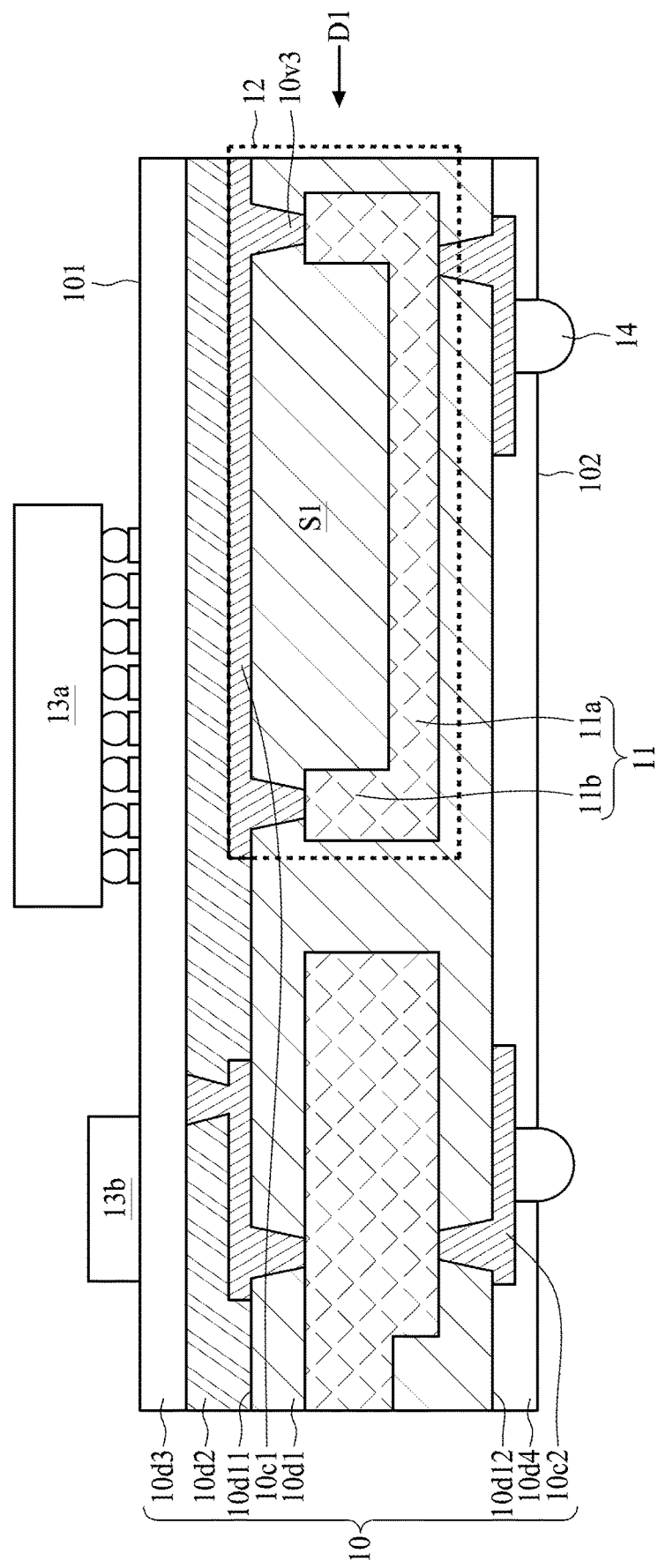
FIG. 1A illustrates a cross-sectional view of a semiconductor device package, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1B:
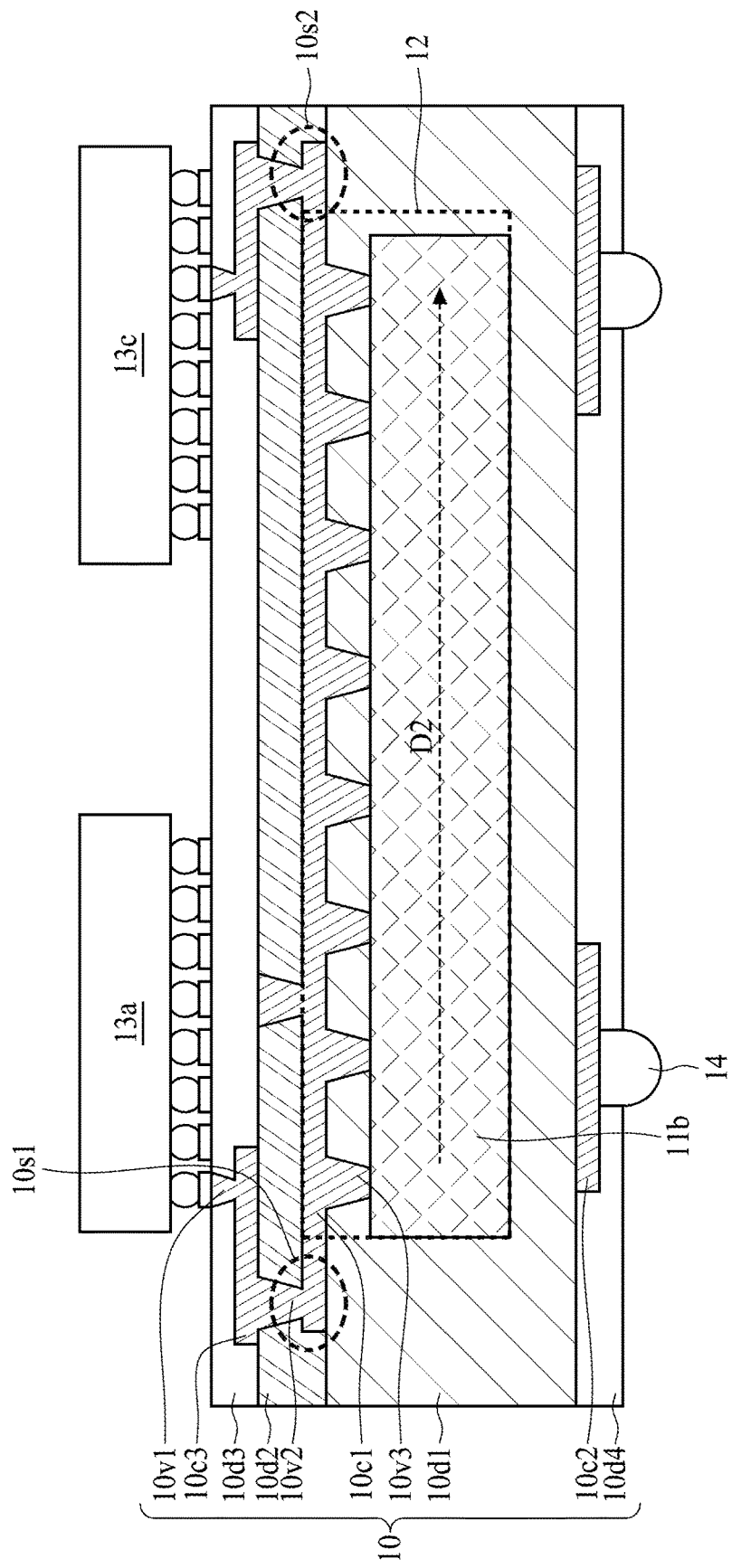
FIG. 1B illustrates a side view of the semiconductor device package as shown in FIG. 1A, in accordance with some embodiments of the present disclosure.
Figure 1C:
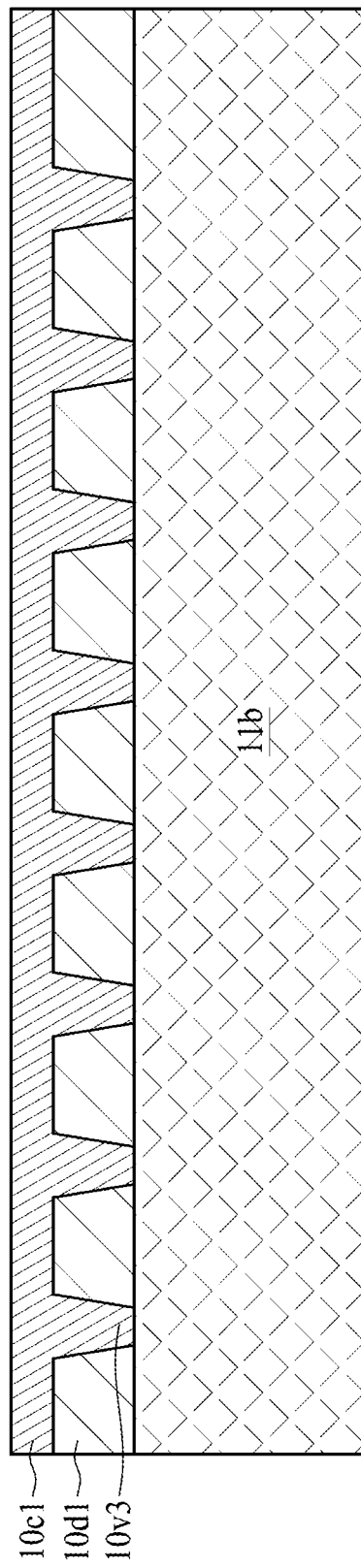
FIG. 1C illustrates an enlarged view of a waveguide of the semiconductor device package as shown in FIG. 1B, in accordance with some embodiments of the present disclosure.
Figure 1D:
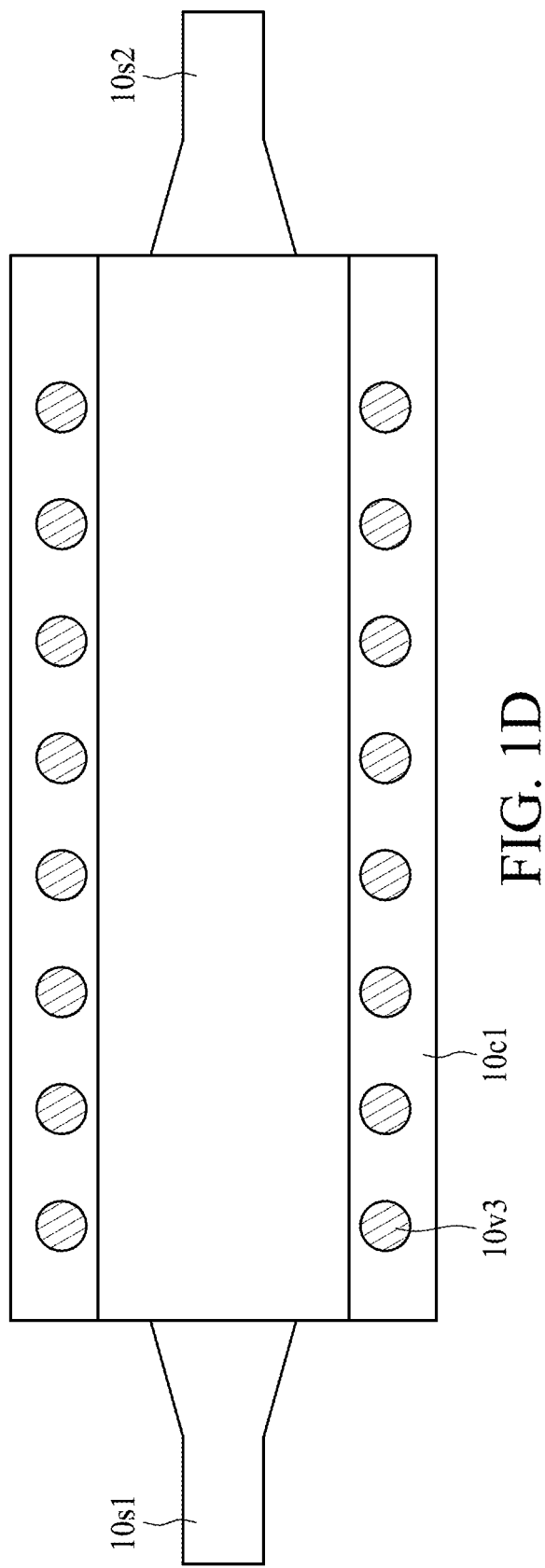
FIG. 1D illustrates a top view of the waveguide as shown in FIG. 1C, in accordance with some embodiments of the present disclosure.

FIG. 1A illustrates a cross-sectional view of a semiconductor device package 1, in accordance with some embodiments of the present disclosure. FIG. 1B illustrates a side view of the semiconductor device package 1 from a direction D1 as shown in FIG. 1A, in accordance with some embodiments of the present disclosure. FIG. 1C illustrates an enlarged view of a waveguide 12 as shown in FIG. 1B, in accordance with some embodiments of the present disclosure. FIG. 1D illustrates a top view of the waveguide 12 as shown in FIG. 1C, in accordance with some embodiments of the present disclosure. The semiconductor device package 1 includes a substrate 10, a conductive lid 11, a waveguide 12, electronic components 13a, 13b and electrical contacts 14.

The substrate 10 (e.g., a circuit layer or a build-up layer) includes one or more interconnection layers (e.g., conductive layers 10c1, 10c2) and one or more dielectric layers (e.g., dielectric layers 10d1, 10d2, 10d3, 10d4). In some embodiments, the conductive layers 10c1 and 10c2 may include patterned conductive layer, such as redistribution layers (RDL). The conductive layer 10c1 is disposed on a surface 10d11 of the dielectric layer 10d1 and covered by the dielectric layer 10d2. The conductive layer 10c2 is disposed on a surface 10d12 of the dielectric layer 10d1 and covered by the dielectric layer 10d4.

In some embodiments, each of the dielectric layers 10d1, 10d2, 10d3 and 10d4 may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, each of the dielectric layers 10d1, 10d2, 10d3 and 10d4 may include an inorganic material, such as silicon, a ceramic or the like. Each of the conductive layers 10c1 and 10c2 may be or include a conductive material such as a metal or metal alloy. Examples of the conductive material include gold (Au), silver (Ag), copper (Cu), platinum (Pt), Palladium (Pd), other metal(s) or alloy(s), or a combination of two or more thereof. In some embodiments, there may be any number of conductive layers or dielectric layers depending on design specifications.

The conductive lid 11 (e.g., a metal lid or a leadframe) is disposed within the substrate 10. For example, the conductive lid 11 is encapsulated or covered by the dielectric layer 10d1 of the substrate 10. For example, the conductive lid 11 is embedded within the dielectric layer 10d1 of the substrate 10. In some embodiments, the conductive lid 11 may include Au, Ag, Cu, Pt, Pd, other metal(s) or alloy(s), or a combination of two or more thereof.

As shown in FIG. 1A, the conductive lid 11 may include a base portion 11a and an extending portion 11b extending upwardly from the base portion 11a. The extending portion 11b is disposed at the edges of the base portion 11a. As shown in FIG. 1B, the extending portion 11b is disposed along the edges of the base portion 11a. For example, the extending portion 11b may function as a sidewall of the base portion. For example, the extending portion 11b and the base portion 11a may define a recess or a space.

The conductive layer 10c1 (e.g., the patterned conductive layer, such as a redistribution layer, RDL) is disposed on a surface 10d11 of the dielectric layer 10d1 and electrically connected to the extending portion 11b of the conductive lid 11 through the conductive via 10v3. For example, the conductive via 10v3 partially penetrates the dielectric layer 10d1 and is electrically connected to the extending portion 11b of the conductive lid 11. The conductive via 10v3 is in contact with the extending portion 11b of the conductive lid 11. As shown in FIG. 1B, a plurality of conductive vias 10v3 electrically connect the conductive layer 10c1 with the extending portion 11b of the conductive lid 11, and the conductive vias 10v3 may be spaced apart from each other. For example, there is a gap between two adjacent conductive vias 10v3. For example, from the side view of the waveguide 12 as shown in FIG. 1B, there are a plurality of openings or holes on the sidewall of the waveguide 12. The conductive layer 10c1, the conductive vias 10v3 and the conductive lid 11 may define a cavity S1 (or a space). In some embodiments, the cavity S1 is filled with the dielectric layer 10d1.

As shown in FIG. 1A, FIG. 1B, FIG. 1C and FIG. 1D, the waveguide 12 may be defined by the conductive lid 11, the conductive layer 10c1 and the conductive vias 10v3. The waveguide 12 is configured to guide the signal (e.g., electromagnetic waves) along a direction D2 (i.e., the direction substantially perpendicular to the direction D1) as shown in FIG. 1B. The waveguide 12 is configured to transmit the signal from a terminal of the waveguide 12 to an opposite terminal of the waveguide 12. For example, as shown in FIG. 1B and FIG. 1D, a conductive layer 10s1 of the substrate 10 electrically connected to and in contact with the waveguide 12 can function as a terminal of the waveguide 12, and a conductive layer 10s2 of the substrate 10 electrically connected to and in contact with the waveguide 12 can function as an opposite terminal of the waveguide 12. In some embodiments, the conductive layer 10s1 of the substrate 10 is in contact with the conductive layer 10c1 of the waveguide 12, and the conductive layer 10s2 of the substrate 10 is in contact with the conductive layer 10c1 of the waveguide 12. In other embodiments, the conductive layer 10s1 and/or the conductive layer 10s2 may be in contact with the conductive lid 11 (e.g., the extending portion 11b). The signal may be transmitted from one terminal (i.e., the conductive layer 10s1) to an opposite terminal (i.e., the conductive layer 10s2). In some embodiments, the conductive layers 10s1 and 10s2 may function as a microstrip line.

In some embodiments, since the waveguide 12 can guide or direct the electromagnetic waves by restricting the transmission of energy to one direction (e.g., along the direction D2 as shown in FIG. 1B), the waveguide 12 can have a minimal loss of energy of the signal. In some embodiments, the power (or a distribution of an electric field) of the signal at one terminal of the waveguide 12 is substantially the same as the power (or a distribution of an electric field) of the signal transmitted to an opposite terminal of the waveguide 12. In some embodiments, the size (or dimension) of the opening at one terminal of the waveguide 12 is substantially the same as that at an opposite terminal of the waveguide 12.

As shown in FIG. 1A and FIG. 1B, the electronic components 13a and 13b are disposed on the surface 101 of the substrate 10 and electrically connected to the substrate 10. In some embodiments, each of the electrical components 13a and 13c may be an active component, such as an integrated circuit (IC) chip or a die. The electronic component 13b may be a passive electrical component, such as a capacitor, a resistor or an inductor. The electronic components 13a, 13b and 13c can be electrically connected to the substrate 10 by way of flip-chip or wire-bond techniques. In some embodiments, the semiconductor device package 1 may further include a package body (e.g., a molding compound, not shown in the drawings) to cover the electronic components 13a, 13b and 13c.

In some embodiments, since the waveguide 12 can achieve a low signal loss transmission (compared with the conductive lines 12c1, 12c2), the waveguide 12 may be used for signal (especially for high-frequency signal) transmission between the electronic components 13a, 13b and 13c. For example, as shown in FIG. 1B, the signal transmission between the electronic components 13a and 13c can be achieved by the waveguide 12. For example, the waveguide 12 can be configured to transmit signal from a place to another place (e.g., from the electronic component 13a to the electronic component 13c) in a package or in a module. In some embodiments, the electrical components 13a and 13c may include a high-frequency circuit, such as an oscillator, an amplifier, a mixer, a modulator, a filter or the like. In some embodiments, one of the electrical components 13a and 13c may be replaced by an antenna (or a feeding line of an antenna).

The electronic component 13a is electrically connected to one terminal (e.g., the conductive layer 10s1) of the waveguide 12 (e.g., to the conductive layer 10c1) through the interconnection layer (e.g., through the conductive vias 10v1, 10v2 and the conductive layer 10c3 as shown in FIG. 1B) of the substrate 10. Similarly, the electronic component 13c is electrically connected to an opposite terminal (e.g., the conductive layer 10s2) of the waveguide 12 (e.g., to the conductive layer 10cl) through the interconnection layer of the substrate 10. The signal (e.g., electromagnetic waves) can be transmitted between the electronic components 13a and 13c through the cavity S1 of the waveguide 12.

The electrical contacts 14 (e.g. solder balls) are disposed on the surface 102 of the substrate 10 and can provide electrical connections between the semiconductor package device 1 and external components (e.g. external circuits or circuit boards). In some embodiments, the electrical contacts 14 may include controlled collapse chip connection (C4) bumps, ball grid arrays (BGA) or land grid arrays (LGA).

In some embodiments, the waveguide 12 may be formed by the following operations: (i) providing the conductive lid 11; (ii) forming the dielectric layer 10dl covering the conductive lid 11 and within the cavity S1 by, for example, lamination or other suitable techniques; (iii) forming the conductive vias 10v3 penetrating the dielectric layer 10d1 to be in contact with the extending portion 11b of the conductive lid 11; and (iv) forming the conductive layer 10c1 on the dielectric layer 11 and in contact with the conductive vias 10v3.

Figure 2A:
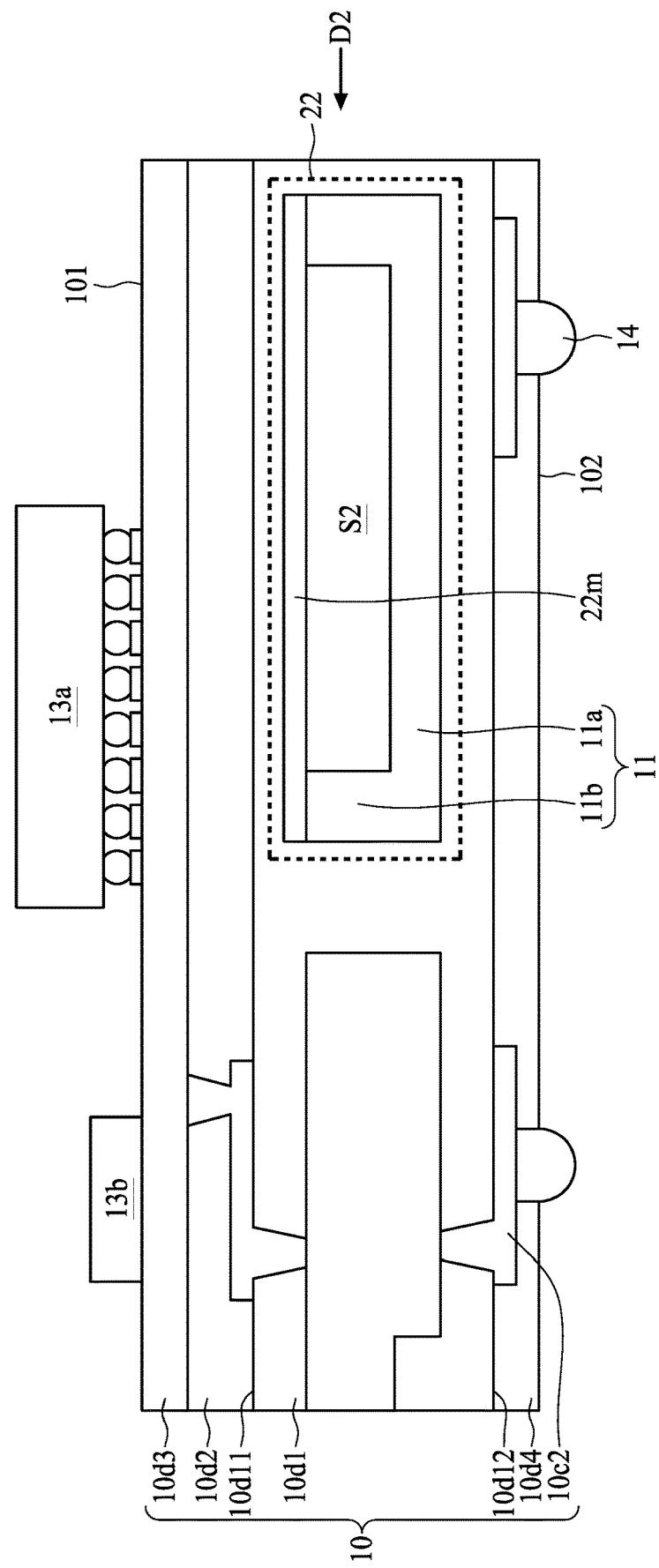
FIG. 2A illustrates a cross-sectional view of a semiconductor device package, in accordance with some embodiments of the present disclosure.
Figure 2B:
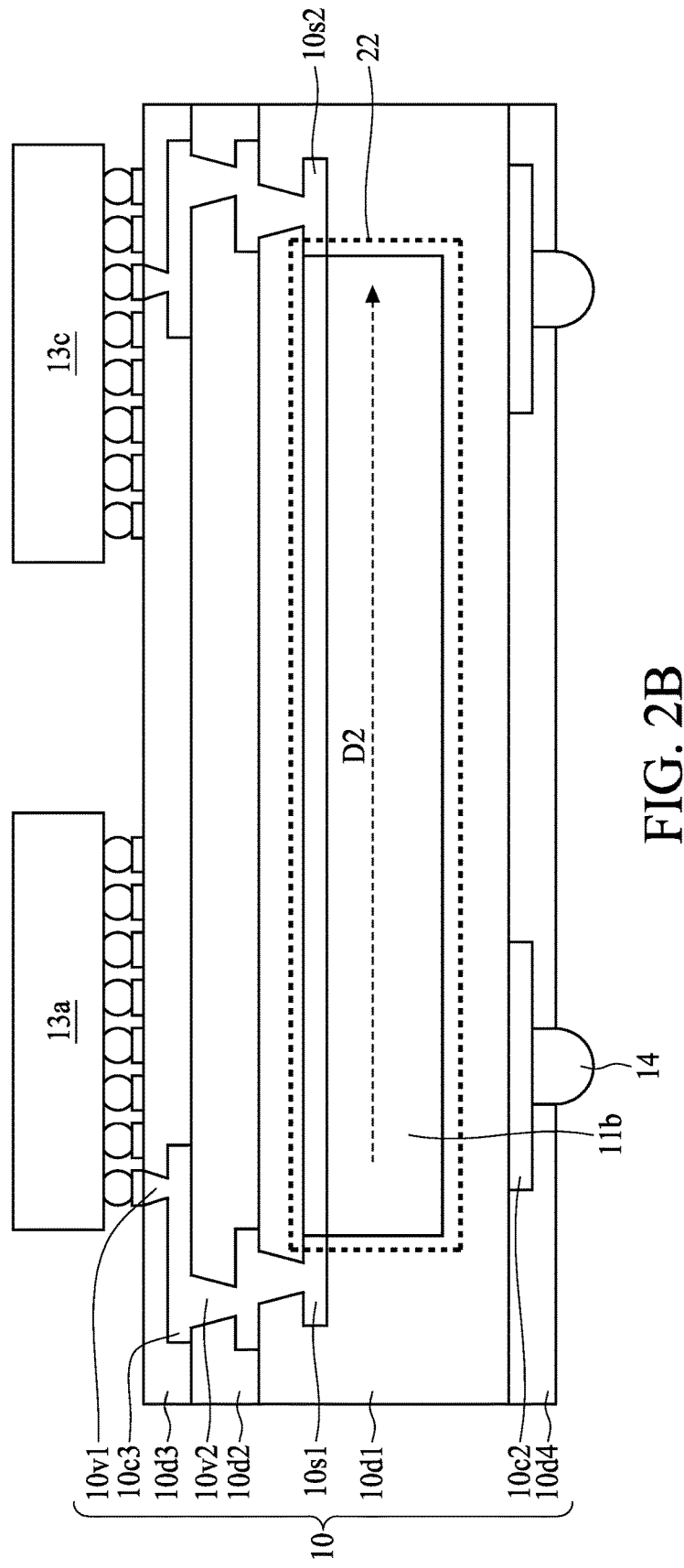
FIG. 2B illustrates a side view of the semiconductor device package as shown in FIG. 2A, in accordance with some embodiments of the present disclosure.

FIG. 2A illustrates a cross-sectional view of a semiconductor device package 2, in accordance with some embodiments of the present disclosure. FIG. 2B illustrates a side view of the semiconductor device package 2 from a direction D2 as shown in FIG. 2A, in accordance with some embodiments of the present disclosure. The semiconductor device package 2 as illustrated in FIG. 2A and FIG. 2B is similar to the semiconductor device package 1 as illustrated in FIG. 1A and FIG. 1B, and the differences therebetween are described below.

The waveguide 12 of the semiconductor device package 1 is defined by the conductive layer 10c1, the conductive vias 10v3 and the conductive lid 11, while the waveguide 22 of the semiconductor device package 2 is defined by a metal layer 22m (e.g., a metal plate or a metal film) and the conductive lid 11. For example, the waveguide 22 may be formed by connecting the metal layer 22m on the extending portion 11b of the conductive lid 11. For example, the metal layer 22m is in contact with the extending portion 11b of the conductive lid 11. As shown in FIG. 2A, the metal layer 22m and the conductive lid 11 define a cavity S2 (or a space). In some embodiments, the dielectric layer 10d1 is not disposed within the cavity S2. For example, the cavity S2 may be an air cavity. Since the air has a dielectric constant (Dk) less than the Dk of a dielectric material, the waveguide 22 can have a better performance for data transmission (especially for high-frequency signal).

As shown in FIG. 2B, unlike the conductive vias 10v3 as shown in FIG. 1B spaced apart from each other, the metal layer 22m may be an entire metal plate (or metal film), and thus there is no opening or hole on the sidewall of the waveguide 22. In some embodiments, the conductive layers 10s1 and 10s2 may be electrically connected to and in contact with two opposite lateral surfaces of the metal layer 22m. Alternatively, the conductive layers 10s1 and 10s2 may be electrically connected to and in contact with a top surface of the metal layer 22m.

In some embodiments, the waveguide 22 may be formed by the following operations: (i) providing the conductive lid 11; (ii) connecting the metal layer 22m on the extending portion 11b of the conductive lid 11; and (iii) forming the dielectric layer 10d1 covering the conductive lid 11 and the metal layer 22m by, for example, lamination or other suitable techniques.

Figure 3:
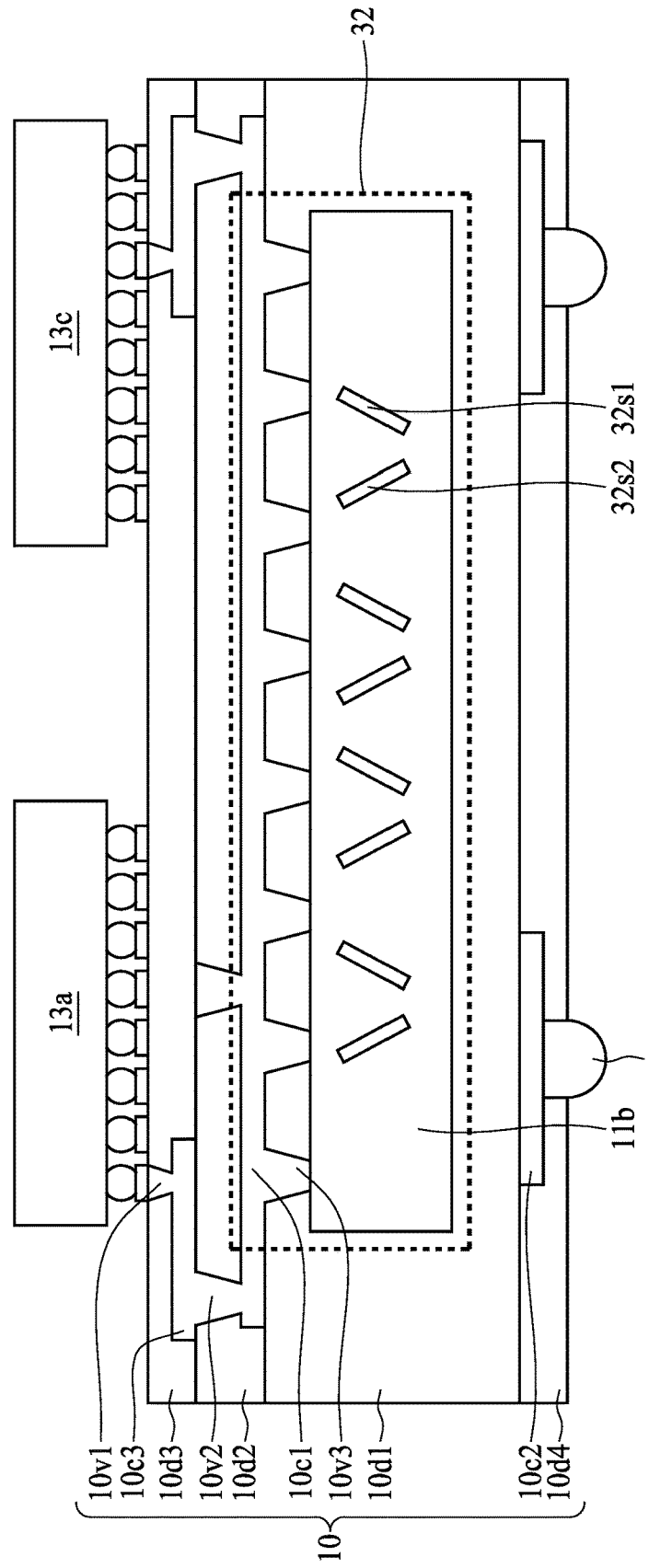
FIG. 3 illustrates a cross-sectional view of a semiconductor device package, in accordance with some embodiments of the present disclosure.

FIG. 3 illustrates a cross-sectional view of a semiconductor device package 3, in accordance with some embodiments of the present disclosure. The semiconductor device package 3 is similar to the semiconductor device package 1 as shown in FIG. 1B, and the differences therebetween are described below.

The semiconductor device package 3 includes a waveguide 32. The waveguide 32 is similar to the waveguide 12 as shown in FIG. 1B, excerpt that the waveguide 32 includes a plurality of slots 32s1, 32s2 on a sidewall of the extending portion 11b of the conductive lid 11. Each of the first set of slots 32s1 is inclined in a first direction. Each of the second set of slots 32s2 is inclined in a second direction. In some embodiments, the first direction is different from the second direction. For example, the first direction is not parallel to the second direction. In some embodiments, the waveguide 32 may also function as a slot antenna. The waveguide 32 may be configured to transmit or receive electromagnetic waves substantially perpendicular to the sidewall of the waveguide 32. In some embodiments, the slots 32s1 and 32s2 are disposed at or adjacent to the sidewall of the waveguide. For example, the slots 32s1 and 32s2 may be exposed from the dielectric layer 10d1 of the substrate 10, and thus the radiation emitted from the slots 32s1 and 32s2 would not be affected by the substrate 10.

Figure 4:
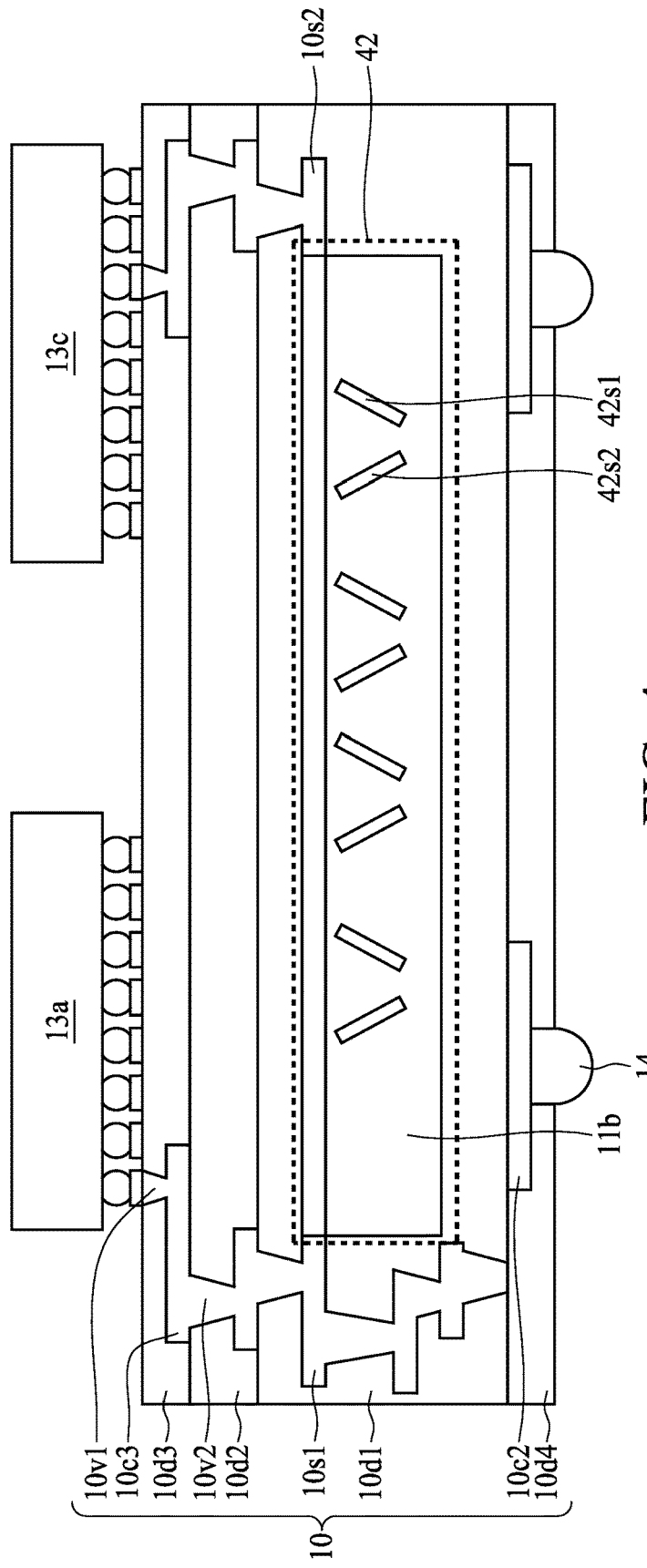
FIG. 4 illustrates a cross-sectional view of a semiconductor device package, in accordance with some embodiments of the present disclosure.

FIG. 4 illustrates a cross-sectional view of a semiconductor device package 4, in accordance with some embodiments of the present disclosure. The semiconductor device package 4 is similar to the semiconductor device package 2 as shown in FIG. 2B, and the differences therebetween are described below.

The semiconductor device package 4 includes a waveguide 42. The waveguide 42 is similar to the waveguide 22 as shown in FIG. 2B, excerpt that the waveguide 42 includes a plurality of slots 42s1, 42s2 on a sidewall of the extending portion 11b of the conductive lid 11. Each of the first set of slots 42s1 is inclined in a first direction. Each of the second set of slots 42s2 is inclined in a second direction. In some embodiments, the first direction is different from the second direction. For example, the first direction is not parallel to the second direction. In some embodiments, the waveguide 42 may also function as a slot antenna. The waveguide 42 may be configured to transmit or receive electromagnetic waves substantially perpendicular to the sidewall of the waveguide 42.

Figure 5A:
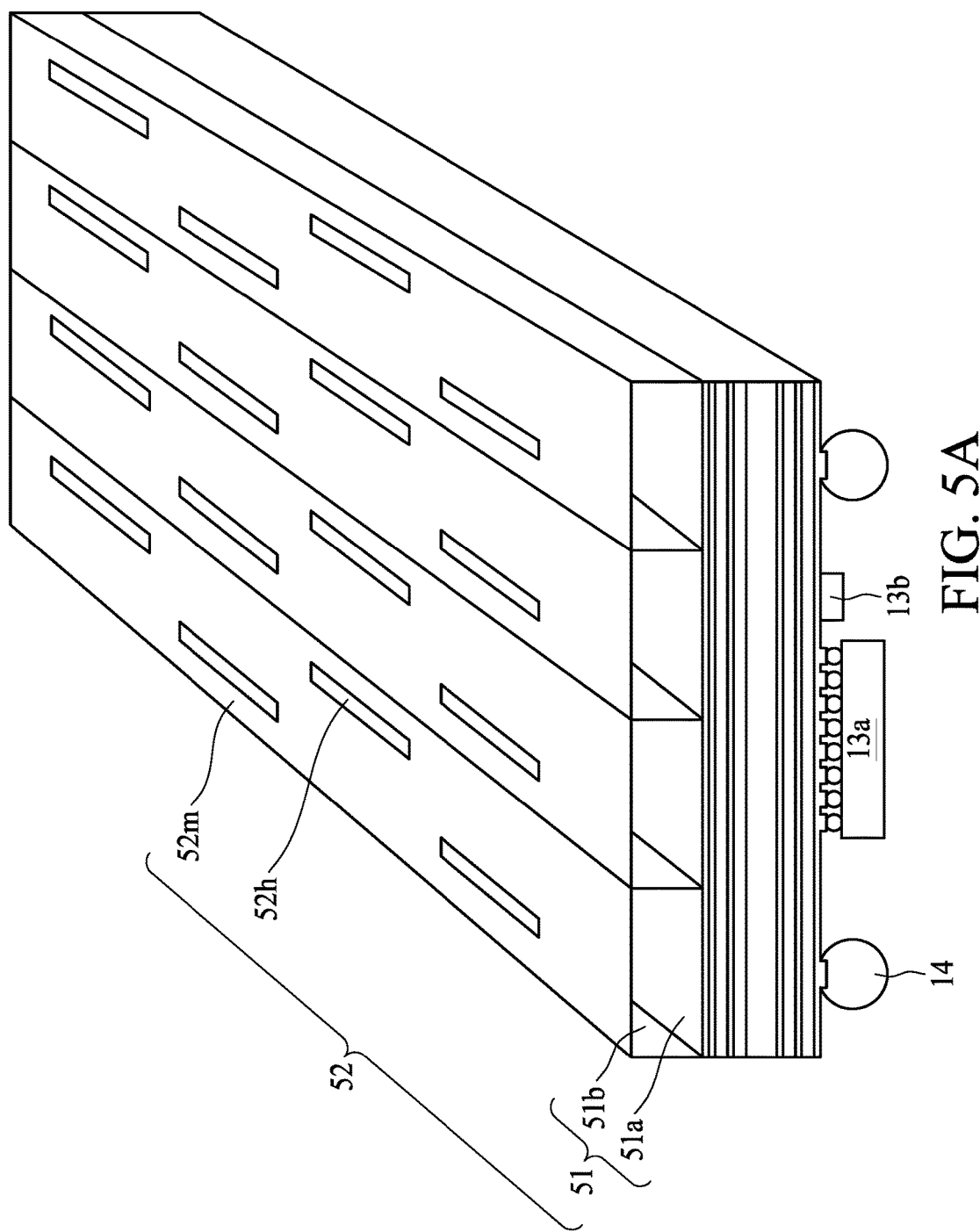
FIG. 5A illustrates a perspective view of a semiconductor device package, in accordance with some embodiments of the present disclosure.
Figure 5B:
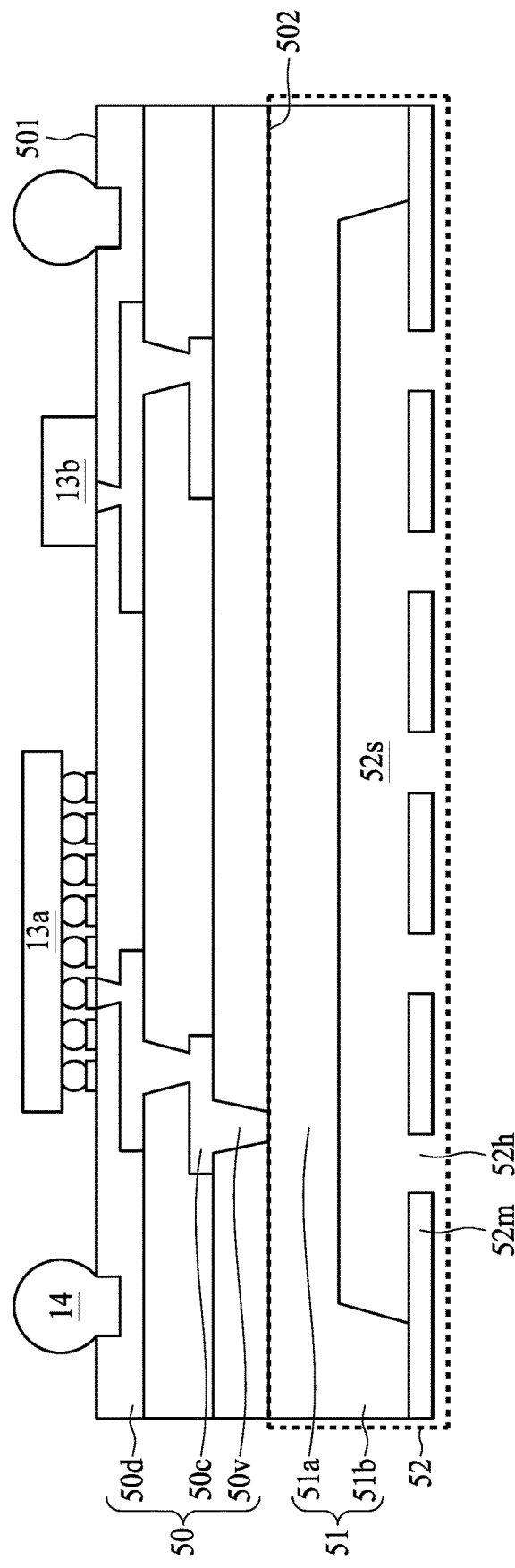
FIG. 5B illustrates a cross-sectional view of the semiconductor device package as shown in FIG. 5A, in accordance with some embodiments of the present disclosure.

FIG. 5A illustrates a perspective view of a semiconductor device package 5, in accordance with some embodiments of the present disclosure. FIG. 5B illustrates a cross-sectional view of the semiconductor device package 5 as shown in FIG. 5A, in accordance with some embodiments of the present disclosure. The semiconductor device package 5 includes a substrate 50, a conductive lid 51, an antenna 52, electronic components 13a, 13b and electrical contacts 14.

The substrate 50 (e.g., a circuit layer or a build-up layer) includes one or more interconnection layers (e.g., conductive layers 50c) and one or more dielectric layers 50d. In some embodiments, the conductive layers 50c may include patterned conductive layer, such as a RDL. A portion of the conductive layers 50c is covered by the dielectric layer 50d while the rest portion of the conductive layers 50c may be exposed from the dielectric layer 50d for electrical connections. The conductive layers 50c disposed on different layers of the dielectric layers 50d can be electrically connected through a conductive via 50v.

In some embodiments, each of the dielectric layers 50d may include an organic material, a solder mask, a PI, an epoxy, an ABF, one or more molding compounds, one or more pre-impregnated composite fibers (e.g., a pre-preg fiber), a BPSG (BPSG), a silicon oxide, a silicon nitride, a silicon oxynitride, an USG, any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, each of the dielectric layers 50d may include an inorganic material, such as silicon, a ceramic or the like. Each of the conductive layers 50c may be or include a conductive material such as a metal or metal alloy. Examples of the conductive material include Au, Ag, Cu, Pt, Pd, other metal(s) or alloy(s), or a combination of two or more thereof. In some embodiments, there may be any number of conductive layers or dielectric layers depending on design specifications.

The electronic components 13a and 13b are disposed on the substrate 50 and electrically connected to the substrate 50. The electrical contacts 14 are disposed on the substrate 50 and electrically connected to the substrate 50 to provide electrical connections between the semiconductor device package 5 and external components (e.g. external circuits or circuit boards). In some embodiments, the electronic components 13a, 13b and the electrical contacts 14 are the same or similar to the electronic components 13a, 13b and the electrical contacts 14 as illustrated in FIG. 1A and FIG. 1B.

The conductive lid 51 (e.g., a metal lid or a leadframe) is disposed on a surface 502 of the substrate 50 opposite to the surface 501 on which the electronic components 13*a* and 13*b* are disposed. In some embodiments, the conductive lid 51 can be connected to the surface 502 of the substrate 50 through an adhesive layer. The substrate 50 may include a feeding element (not shown) electrically connected to the conductive via 50*v*, and the conductive lid 51 may include an opening (not shown) corresponding to the feeding element. The signal (e.g., RF signal) can be transmitted from the feeding element to the cavity 52*s* through the opening of the conductive lid 51, and then radiated to the outside through the slots 52*h*. In some embodiments, the conductive lid 11 may include Au, Ag, Cu, Pt, Pd, other metal(s) or alloy(s), or a combination of two or more thereof.

As shown in FIG. 5B, the conductive lid 51 (e.g., a metal lid or a leadframe) may include a base portion 51*a* and an extending portion 51*b* extending from the base portion 11*a*. The base portion 51*a* is in contact with the substrate 50 and electrically connected to the substrate 50. The extending portion 51*b* is disposed at the edges of the base portion 51*a*. A metal layer 52*m* (e.g., a metal plate or a metal film) is disposed on the extending portion 51*b* of the conductive lid 51. The metal layer 52*m* and the conductive lid 51 may define a cavity 52*s* (or a space). The metal layer 52*m* include a plurality of slots 52*h* to expose the cavity 52*s*.

In some embodiments, the metal layer 52*m* and the conductive lid 51 may define the antenna 52 (e.g., a slot antenna). The antenna 52 is configured to transmit or receive electromagnetic waves is a direction substantially perpendicular to the surface of the substrate 50 on which the conductive lid 51 is disposed.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a conductive structure including a base portion and an extending portion extending upwardly from the base portion, wherein the conductive structure defines a waveguide having a cavity;
   a dielectric layer encapsulating the conductive structure; and
   a first conductive via partially penetrating the dielectric layer and connecting a bottom surface of the base portion of the conductive structure.

2. The semiconductor device package of claim 1, wherein the dielectric layer is partially disposed within the cavity and contacts the extending portion of the conductive structure.

3. The semiconductor device package of claim 1, further comprising:
   an electronic component; and an antenna, wherein the waveguide is configured to transmit a signal provided by the electronic component to the antenna.

4. The semiconductor device package of claim 1, wherein the conductive structure has a first edge and a second edge opposite to the first edge, and the dielectric layer extends continuously over the first edge and the second edge.

5. The semiconductor device package of claim 1, further comprising:
a second conductive via partially penetrating the dielectric layer and connecting a top surface of the extending portion of the conductive structure.

6. The semiconductor device package of claim 5, wherein the second conductive via and the first conductive via are tapered toward each other.

7. The semiconductor device package of claim 5, wherein the extending portion of the conductive structure vertically overlapped with the second conductive via and the first conductive via.

8. A semiconductor device package, comprising:
a conductive structure including a base portion and a first extending portion served as a first sidewall of the base portion, wherein the base portion and the first extending portion collectively define a waveguide;
an antenna disposed over the conductive structure and electrically connected with the waveguide;
an electronic component disposed over the conductive structure and electrically connected with the waveguide, wherein the waveguide is configured to transmit a signal provided by the electronic component to the antenna along a signal transmitting direction; and
conductive vias contacting the first extending portion and arranged along the signal transmitting direction.

9. The semiconductor device package of claim 8, wherein the conductive vias are spaced at substantially equal intervals, and the conductive lid includes a second extending portion opposite to the first extending portion and extending upwardly from the base portion, wherein the second extending portion serves as a second sidewall of the base portion.

10. The semiconductor device package of claim 9, further comprising:
a conductive layer connecting the first sidewall to the second sidewall, wherein the conductive layer connects the first sidewall through a conductive via tapering toward the first sidewall.

11. The semiconductor device package of claim 10, wherein the conductive layer, the first sidewall, the second sidewall, and the base portion collectively define the waveguide.

12. A semiconductor device package, comprising:
a conductive structure defining a waveguide having a cavity;
a dielectric layer partially disposed within the cavity;
a circuit structure disposed under the conductive structure, wherein the circuit structure includes a conductive via and a feeding element configured to transmit a signal to the cavity through the conductive via; and
an electronic component disposed under the circuit structure, wherein the dielectric layer and the electronic component are disposed at different elevations with respect to the conductive structure.

13. The semiconductor device package of claim 12, further comprising:
a conductive layer disposed over the cavity and including a plurality of slots, wherein the signal is configured to be radiated through at least one of the plurality of slots.

14. The semiconductor device package of claim 12, wherein the waveguide includes a plurality of cavities separated from one another and the dielectric layer is exposed through the plurality of cavities.

15. The semiconductor device package of claim 14, wherein the waveguide includes a plurality of slots arranged in a plurality of rows, and each of the plurality of rows includes a slot array.

16. The semiconductor device package of claim 15, wherein each of the plurality of rows corresponds to one of the plurality of cavities.

17. The semiconductor device package of claim 12, further comprising:
a plurality of electrical contacts disposed under the circuit structure and configured to connect an external device to the circuit structure, and wherein the plurality of electrical contacts are vertically overlapped with the conductive structure.

18. The semiconductor device package of claim 12, further comprising:
a conductive via tapering from the electronic component to the top surface of the conductive structure.

19. The semiconductor device package of claim 12, further comprising:
a passive component disposed under the circuit structure, wherein the electronic component comprises an active component.

20. The semiconductor device package of claim 12, wherein a central line of the electronic component is misaligned with a central line of the cavity in a cross-sectional view.

* * * * *